(12) United States Patent
Cho

(10) Patent No.: US 8,723,551 B2
(45) Date of Patent: May 13, 2014

(54) INTEGRATED CIRCUIT WITH IMPROVED LEVEL SHIFTER

(75) Inventor: Junho Cho, Thornhill (CA)

(73) Assignee: ATI Technologies ULC, Markham, Ontario (CA)

( * ) Notice: Subject to any disclaimer, the term of this patent is extended or adjusted under 35 U.S.C. 154(b) by 1134 days.

(21) Appl. No.: 12/610,750

(22) Filed: Nov. 2, 2009

(65) Prior Publication Data

US 2011/0102383 A1 May 5, 2011

(51) Int. Cl.
*H03K 19/0175* (2006.01)
*G09G 5/00* (2006.01)

(52) U.S. Cl.
USPC .............. 326/80; 326/63; 345/204; 345/214

(58) Field of Classification Search
None
See application file for complete search history.

(56) References Cited

U.S. PATENT DOCUMENTS

| | | | |
|---|---|---|---|
| 4,978,870 A | 12/1990 | Chen et al. | |
| 6,130,557 A | 10/2000 | Drapkin et al. | |
| 6,268,744 B1 | 7/2001 | Drapkin et al. | |
| 6,429,716 B1 | 8/2002 | Drapkin et al. | |
| 6,545,521 B2 | 4/2003 | Dale et al. | |
| 6,667,648 B2 | 12/2003 | Stout et al. | |
| 6,785,107 B1 | 8/2004 | Schmitt | |
| 6,833,746 B2 | 12/2004 | Drapkin et al. | |
| 6,842,043 B1* | 1/2005 | Nguyen et al. | 326/68 |
| 7,541,835 B1* | 6/2009 | Shaikh et al. | 326/56 |
| 7,675,345 B2* | 3/2010 | Fayed | 327/333 |
| 7,782,114 B2* | 8/2010 | Banerjee et al. | 327/333 |
| 8,019,905 B2* | 9/2011 | Wu et al. | 710/14 |
| 2007/0188194 A1* | 8/2007 | Yang et al. | 326/80 |

* cited by examiner

*Primary Examiner* — Alexander H Taningco
*Assistant Examiner* — Nelson Correa
(74) *Attorney, Agent, or Firm* — Faegre Baker Daniels LLP

(57) ABSTRACT

Level shifting circuitry and corresponding enable signal generating circuitry provides improved leakage current control while eliminating the need for supplying reference voltage input in the enable signal generator. The level shifting circuitry is a type of cascode free level shifting circuit that does not include cascode transistors as in the prior art but instead utilizes cross coupled logic to provide level shifting while also utilizing enable signal controlled transistors to control leakage current through the cross coupled logic during power up sequencing. The level shifting circuitry provides improved leakage current limiting structure for power up sequencing whether a lower level supply voltage ramps up faster than the higher level supply voltage or vice a versa.

12 Claims, 8 Drawing Sheets

INTEGRATED CIRCUIT WITH IMPROVED LEVEL SHIFTER

FIELD OF THE DISCLOSURE

The disclosure relates to integrated circuits and more particularly to level shifting circuits.

BACKGROUND OF THE INVENTION

Integrated circuits (ICs) frequently include circuits that operate at different logical high voltage levels. For example, input/output (I/O) circuits frequently operate at a higher voltage than circuits in the core of the IC. A higher voltage can be desirable at the I/O pads to interface properly with other ICs operating at a higher voltage, and to drive the heavily loaded output signals at an acceptable speed. A lower voltage can be desirable in the core of the IC to reduce power consumption and to enable the use of smaller transistors, thereby reducing the overall die size. Thus, many situations exist where an IC includes signals that are generated by a circuit at a first power (e.g., high) level than provided to another circuit operating at a second (e.g., higher or lower) logical high voltage level. To accommodate these situations, level shifter circuits are commonly used.

There have been many trials in prior arts to speed up operation and reduce the power consumption (esp. lower-to-higher voltage level shifter). However, they do not consider leakage currents which can happen during a power-up sequence. Having a proper power-up sequence in a system-on-chip (SOC) is one of the critical design issues since it is related with transistor break-down and/or leakage current resulting in problems. As fabrication processes become nano scale and more sub-systems are combined into a single chip, many power domains are included in SOCs and/or ICs and designers need to prevent silicon break down and reduce leakage current from interfaces. Level shifters are one of the most critical circuits in SOC designs because it operates as an interface circuit between two different power domains.

FIG. 1 is an example of a conventional lower-to-higher voltage level shifter. VDDL and VDDH depict power supplies for lower voltage and higher voltage, respectively. Normally, VDDL and VDDH have 1.0V~1.2V and 1.8V~2.5V, respectively. INV1 and INV2 are CMOS inverters which consist of one PMOS transistor and one NMOS transistor.

FIG. 2 shows a CMOS inverter for INV1 20 and INV2 22 of FIG. 1. P0 and N0 should be core devices for high speed operation with VDDL. FIG. 1 depicts that cross coupled logic 10 is used to convert lower to higher voltage and transistors 12-18 N1, N2, P1 and P2 should be I/O devices in order to endure voltage stress from VDDH. There have been a lot of trials to improve speed and minimize the power consumption from the design but they deal with normal operation after power-up sequence. A few prior arts also show the technique to protect power sequence for level shifter but they affect operating speed or area because of cascode structure.

A drawback of the design is evident during the power-up sequence. Generally, there is a time delay between VDDL and VDDH at the power-up sequence because they are generated from different voltage regulators or have different loads. VDDH either leads VDDL or lags behind VDDL. The duration between VDDH and VDDL can be a few milliseconds.

FIG. 3 is the case when VDDH leads VDDL in a power up sequence with a time delay, Td. In this case, the leakage current is observed from VDDH to ground during Td because X and Y in FIG. 1 become high impedance nodes. High impedance node means that it has an unknown voltage value. P1, P2, N1 and N2 are turned on under the unknown values at X and Y. The total leakage is not negligible when the system has lots of level shifters and it is an issue in mobile applications. The way to block the leakage current in a power-up sequence is to make sure that VDDL leads VDDH to avoid high impedance nodes at X and Y. It is a sort of system design restriction.

FIG. 4 is an example of a prior art level shifter 400 to block the leakage current of FIG. 1 at power-up sequence. Cascode transistors 402 and 404 P3 and P4 are added in the cross coupled logic and connected between PMOS and NMOS transistors P1, N1 and P2, N2. Also, the additional input, ENB enable, is needed to control the cascode transistors P3 and P4. Alternatively P3 and P4 can be replaced with NMOS transistors and placed between input NMOS (N1 and N2) and ground using EN which is an inverted signal from ENB.

The timing relationship among signals is shown in FIG. 5. ENB becomes high before both VDDH and VDDL are turned on and returns to low after both VDDH and VDDL are turned on. The voltage level of ENB should be either equal to or higher than VDDH so that ENB can prevent the leakage current from VDDH to ground during Td.

Comparing FIG. 1, there are also a few drawbacks with respect to the design of FIG. 4. Firstly, additional devices (P3 and P4) not only increase the circuit size but also degrade performance of level shifter due to turn-on resistor and parasitic capacitance added between P1 and N1 or P2 and N2.

Secondly, an extra start-up signal is needed, ENB, which has a new timing requirement with VDDH and VDDL. In general, ENB can be implemented from the first power-up supply on the system. FIG. 6 depicts VDDR is the first power-up supply which is related with start-up operation in the system. ENB is turned on along with VDDR and off after VDDH and VDDL are turned on. However, ENB can not be directly generated from VDDR because VDDR has a wide voltage level according to system configurations and applications. Its voltage level is 1.5V~2.8V and can be either lower or higher than VDDH which has 1.8V~2.5V. The wide voltage range of VDDR gives designer burden to decide the size of P3 and P4. Thus, another level shifter is needed to convert ENB voltage level from VDDR to VDDH.

FIG. 7 shows a prior art enable signal generator that converts the ENB voltage level from VDDR to VDDH. It has the same structure as FIG. 1 but VDDL is replaced with VDDR. START has the same voltage level as VDDR and it is delivered from the start-up signal in the system. FIG. 8 shows the timing diagram including START into FIG. 6.

Cross coupled logic enables to easily convert an input signal which has a wide voltage range to an output signal which has fixed voltage level. INV3 and INV4 (700, 702) are used to get complementary inputs from START. I/O devices should be used for INV3 and INV4 to prevent silicon break down because VDDR is higher than core voltage (VDDL). P10, P11, N10 and N11 (704-710) should be also I/O devices to avoid break down from VDDH.

Thirdly, another drawback of this design is that the VDDR power rail should be delivered into the macro block. The macro block is an independent circuit module which is reused to increase design efficiency. Normally, it has its own power domain. VDDR is used to generate complimentary inputs from START. Unfortunately, VDDR cannot typically be replaced with VDDH because of a leakage current from VDDH to ground. For example, if VDDR is lower than VDDH then both NMOS and PMOS of INV3 and INV4 are turned on simultaneously and leakage current flows from VDDH and ground. The usage of VDDR makes system level layout more complicated because of power rail delivery cross other macros.

Therefore, a need exists for an improved level shifting circuit and power sequence control design.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Figure 1:
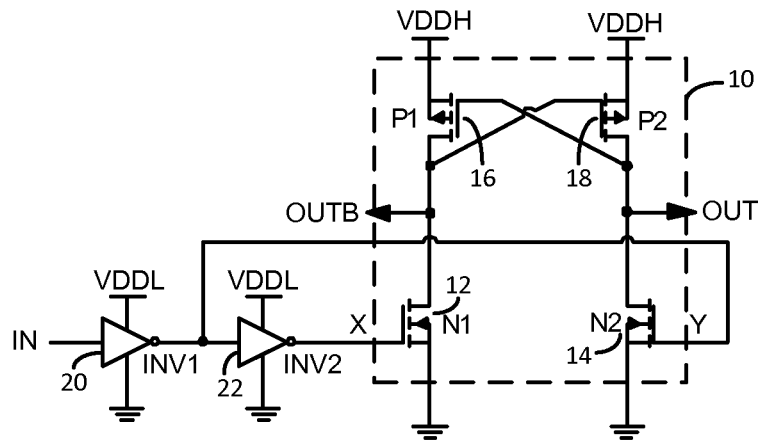
FIG. 1 is a circuit diagram illustrating one example of a prior art lower to higher voltage level shifter.

Level shifting circuitry and corresponding enable signal generating circuitry provides improved leakage current control while eliminating the need for supplying reference voltage input in the enable signal generator. The level shifting circuitry is a type of cascode free level shifting circuit that does not include cascode transistors as in the prior art but instead utilizes cross coupled logic to provide level shifting while also utilizing enable signal controlled transistors to control leakage current through the cross coupled logic during power up sequencing. The level shifting circuitry provides improved leakage current limiting structure for power up sequencing whether a lower level supply voltage ramps up faster than the higher level supply voltage or vice a versa.

In one example, level shifting circuitry is interposed between core logic and input/output circuitry and shifts the logic level of outgoing data or incoming data from/to the I/O circuitry for the core logic. In one example, the level shifting circuitry includes a plurality of PMOS transistors and first and second NMOS transistors that are arranged in as cross coupled logic. Additional enable signal controlled NMOS transistors are provided wherein one NMOS transistor is coupled in parallel with an NMOS transistor in the cross coupled logic, and another NMOS transistor is coupled to a gate of another NMOS transistor in the cross coupled logic to provide control of leakage current of the cross coupled logic during startup conditions (i.e., a power up sequence). In one example, the level shifting circuitry is responsive to a pair of enable signals wherein each of the enable signals has a different logical high level. In one example, one of the enable signals has a logical high value corresponding to the logical high value of VDDH where the other enable signal has a logical high value corresponding to VDDL.

In one example, the level shifting circuitry includes NOR logic that also provides leakage current limitation and the NOR logic has an output coupled to an NMOS transistor and an input responsive to input data and to one of the pair of enable signals. In operation, the NOR logic blocks leakage from VDDL to ground through one of the NMOS transistors during the startup sequence. The cross coupled logic in the level shifting circuitry produces complementary output signals (when the system is in the output mode) based on the input data. The level shifting circuitry also utilizes an inverter interposed between the NOR logic and the gate of the NMOS transistor.

In addition, the integrated circuit includes enable signal generator logic that generates the pair of enable signals, for the level shifting circuitry during startup conditions, whose logic high levels correspond to each of a plurality of different voltage level supply voltage of the level shifting circuit. In one example, the NMOS transistors coupled to the cross coupled logic of the level shifting circuit are fabricated as transistors having the same gate thickness as transistors in the I/O logic (can withstand a higher voltage level on the gates) and the NOR logic and inverter of the level shifting circuit are fabricated using transistors having thinner gate thicknesses consistent with the core logic. The core logic may be, for example, a central processing unit, graphics processing unit, or any other suitable digital processing logic. In one example, a display device employs the described integrated circuit.

Among other advantages, the described level shifting circuit provides a lower-to-higher voltage level shifter without the need for cascode transistors in the cross coupled logic of the level shifter. Also, it helps prevent silicon breakdown and reduces leakage current with independency of power-up sequence. The circuit blocks the leakage current independently of power-up sequence with less performance degradation of conventional designs which is optimized for speed and power. Moreover, it can be directly applied to the conventional level shifter designs without performance degradation or the addition of power domains.

Figure 9:
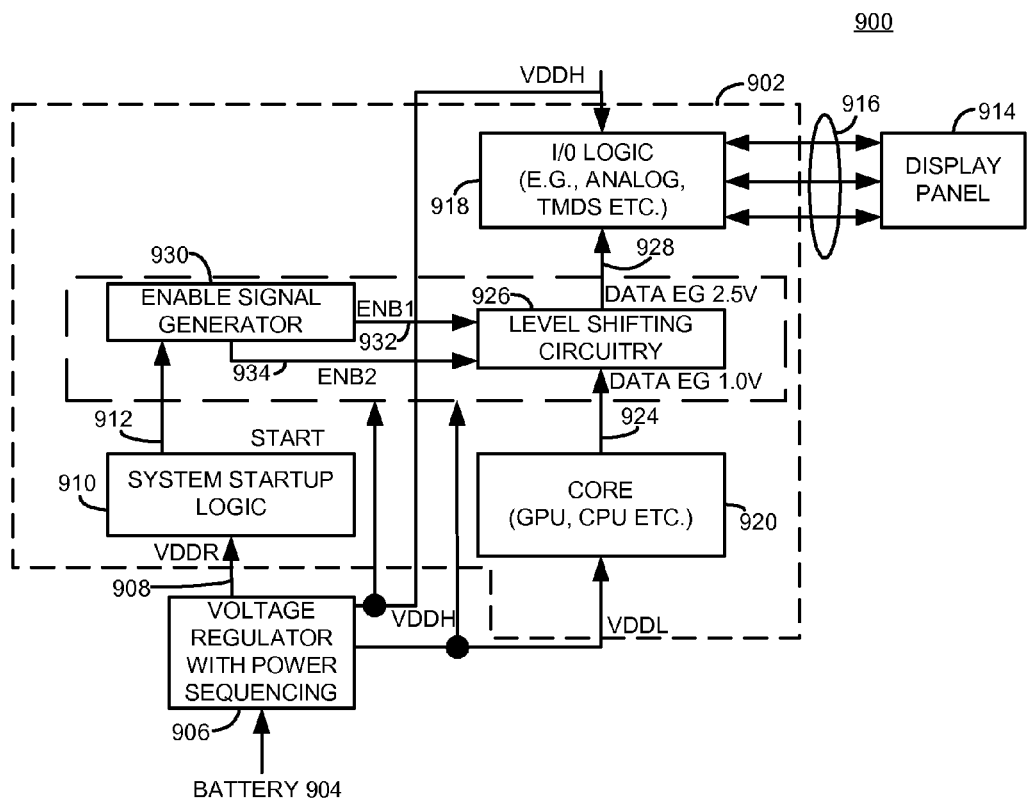
FIG. 9 is a block diagram illustrating one example of a device incorporating an integrated circuit in accordance with one example set forth in the disclosure.

FIG. 9 illustrates one example of a display device 900 (e.g., laptop, handheld, etc.) having an integrated circuit 902 with a cascode free level shifter in accordance with the disclosure. The display device 900 employs a battery 904 which provides a source of power to voltage regulator 906. As known in the art, the voltage regulator 906 provides power sequencing operations and outputs a reference voltage 908 VDDR for system startup logic 910. The voltage regulator 906 provides the VDDH supply voltage and the VDDL supply voltage to the various circuits in the integrated circuit. System startup logic, as known in the art, provides the START signal using VDDR. It also distributes the START signal to blocks which need a start-up sequence. System startup logic also produces the START signal 912 in response to a power up or power down sequence. The display device 900 includes a display 914 such as an LCD panel or any other suitable display. The display receives display information 916 from input/output circuitry 918 in the integrated circuit 902. The integrated circuit 902 also includes core logic 920 that may be, for example, a graphics processing unit, central processing unit, or any other suitable logic that generates, transmits and receives data. The device in this example is shown in an output mode wherein data is output from the core logic 920 to the display panel 914. However, it will be recognized that level shifting circuitry 926 suitably operates in the opposite direction to, for example, downshift data. In this example, the core logic 920 provides data 924 to the level shifting circuitry 926 at a voltage level of approximately 1.0 volts. The level shifter circuitry 926 shifts the logic level up and outputs data 928 to the I/O logic 918 at a voltage level of approximately 2.5 volts. However, it will be recognized that any suitable level may be employed.

In this example, the I/O logic 918 may be, for example, analog drivers and receivers that provide, for example, TMDS information, or may be I/O drivers or any suitable I/O circuitry as known in the art. The integrated circuit 902 also includes the enable signal generator logic 930 that is responsive to the START signal 912 and produces a plurality of enable signals ENB1 932 and ENB2 934. These enable signals are used by the level shifting circuitry 926 during power up to control leakage current as further set forth below.

Figure 10:
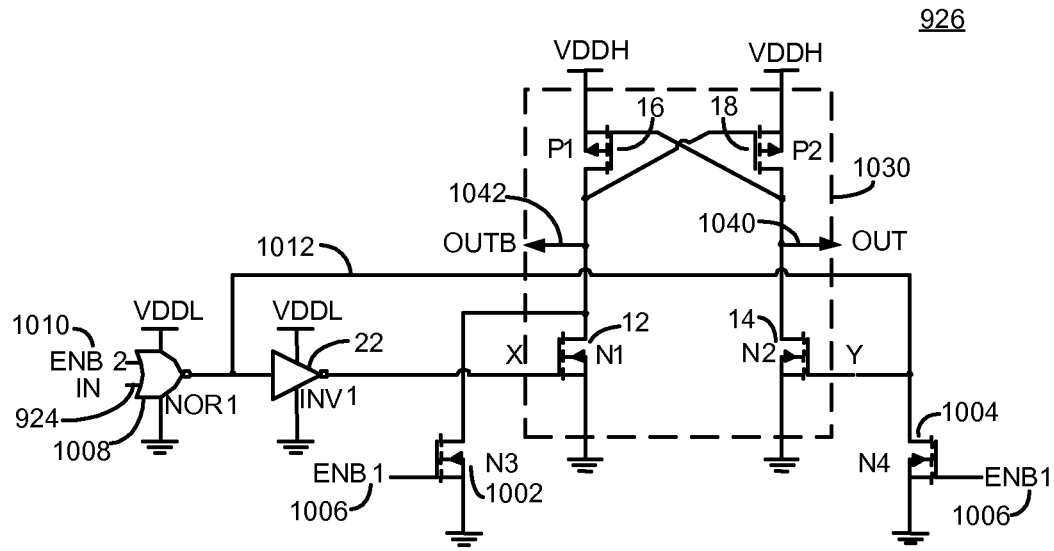
FIG. 10 is a circuit diagram illustrating one example of level shifting circuitry in accordance with one embodiment set forth in the disclosure.
Figure 11:
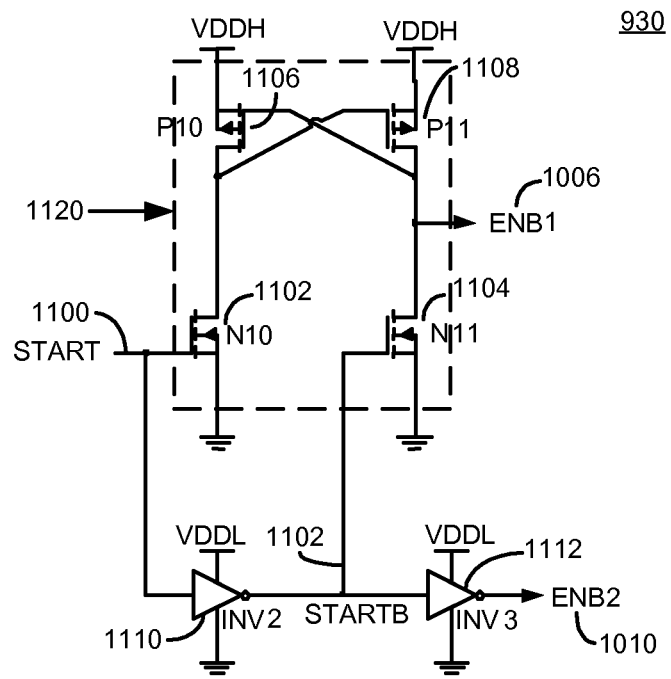
FIG. 11 is a circuit diagram illustrating one example of enable signal generating circuitry in accordance with one embodiment set forth in the disclosure.

FIGS. 10 and 11 show details of the level shifting circuitry 926 and enable signal generator 930, respectively. The level shifting circuitry 926 that is coupled to the core logic 920 provides level shifted data 928 and includes a plurality of PMOS transistors 16 and 18 and first and second NMOS transistors 12 and 14 arranged as cross coupled logic 1030. Another NMOS transistor 1002 is connected in parallel with NMOS transistor 12. Another NMOS transistor 1004 has a drain coupled to a gate of the NMOS transistor 14 and is operative to control leakage current of the cross coupled logic 1030 during a startup condition. The NMOS transistor 1004 receives enable signal 1006. The NMOS transistor 1004 also has its source connected to the output of NOR logic 1008.

The level shifting circuitry 926 receives the pair of enable signals 1006 and 1010. Each of the enable signals has a different logical high level. The level shifting circuitry 926 includes the NOR logic 1008 that has an output 1012 coupled to the NMOS transistor 1004 and has an input that receives the input data 924 from the core logic. The NOR logic also receives one of the enable signals 1010 in this example. The NMOS transistors 1002 and 1004 are each responsive to the same enable signal 1006. The cross coupled logic 1030 produces complementary output signals 1040 and 1042 depending upon the level of the input data 924. The level shifting circuitry also includes the inverter 22 that is interposed between the NOR logic 1008 and a gate of the NMOS transistor 12.

FIG. 11 illustrates one example of the enable signal generator logic 930 that includes second cross coupled logic 1120. The enable signal generator logic 930 generates a pair of enable signals 1006 and 1010 for the level shifting circuitry 926 during a startup condition based on START signal 1100. The logic high levels of the enable signals 1006 and 1010 correspond to each of a plurality of different voltage level supply voltages of a level shifting circuit 926. As indicated below, the enable signal 1006 has a logic high level of VDDH whereas the logic high level of enable signal 1010 is VDDL.

The enable signal generator logic 930 also includes a plurality of serially connected inverter circuits 1110 and 1112 that each have an input thereof connected to the cross coupled logic 1120 through the gates of the NMOS transistors 1102 and 1104. The serially connected inverter circuits are responsive to the START power up signal 1100. The serially connected inverter circuits 1110 and 1112 produce the second enable signal 1010.

Figure 2:
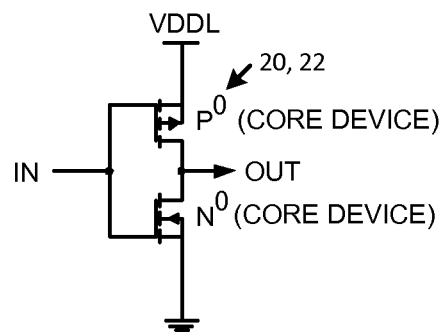
FIG. 2 is an example of a prior art CMOS inverter.
Figure 3:
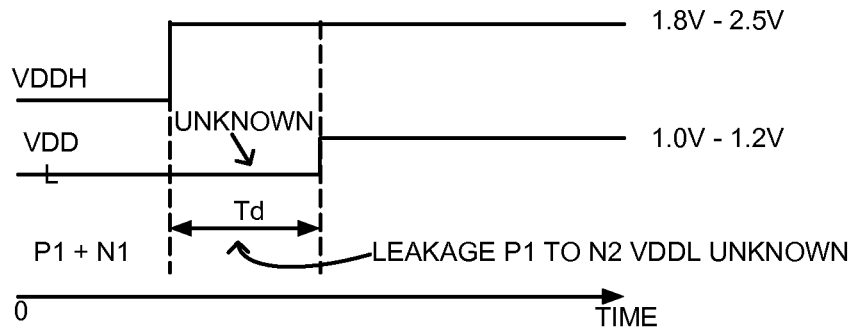
FIG. 3 is a timing diagram illustrating the operation of the circuit of FIG. 1 when a VDDH voltage level leads a VDDL voltage level in a power up sequence.
Figure 12:
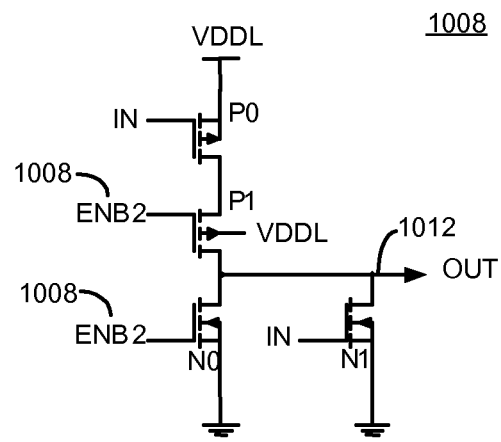
FIG. 12 is one example of NOR logic circuitry in accordance with one embodiment set forth in the disclosure.

In FIG. 10, transistors 1002 and 1004 N3 and N4 are added into the conventional design which is shown in FIG. 1 and their inputs are driven by ENB1 1006 which is from the new enable signal generator 930 in FIG. 11. Nor logic 1008 which is named as NOR1 replaces the inverter of the conventional designs in FIG. 1 and one of its inputs is driven by ENB2 1010 from enable signal generator 930 in FIG. 11. NOR1 1008 and INV1 22 are a conventional CMOS NOR gate and inverter, respectively. INV1 is the same as in FIG. 2 and its P0 and N0 are core devices (have gate thicknesses the same as core device transistors). NOR1 is shown in FIG. 12 and its P0, P1, N0 and N1 are also core devices.

In FIG. 11, START is from the start-up signal in the system and has the VDDR voltage level. START 1100 drives input of INV2 1110 and gate of N10 simultaneously. Its complimentary signal which is named as STARTB 1102 is generated from the output of INV2 1110 which uses VDDL as a supply voltage. ENB2 1010 is generated from output of INV3 1112 and has the same phase as START 1100. INV3 1112 also uses VDDL. Therefore, ENB2 voltage level is converted from START to VDDL through INV2 and INV3. I/O devices (the transistor gate thickness should be the same as those used in the I/O circuit) should be used for INV2 to endure high voltage of START and core devices are used for INV3 because STARTB has the same voltage level as VDDL. START and STARTB drive the cross coupled logic 1120 to generate ENB1. Transistors 1102-1108 P10, P11, N10 and N11 should be I/O devices to endure VDDH. In short, ENB1 and ENB2 have the same voltage level as VDDH and VDDL, respectively.

In FIG. 10, the drain of N3 and drain of N4 are added to OUTB node and Y node, respectively to block the leakage current in a start-up sequence. Also NOR1 blocks leakage from VDDL to ground through N4 in start-up sequence. The operation to prevent leakage current from power-up sequence is explained further below. Small sizes (i.e., same core logic transistors) of N3 and N4 can be used because they just discharge OUTB and Y in a power-up sequence. They do not affect the performance of the level shifter.

In FIG. 11, unlike prior art designs, VDDR power is not used to generate the complimentary signal of START. A START GEN CKT can be embedded into the VDDH and VDDL power domain. STARTB is generated by INV2 and drives cross coupled logic Si with START. Even though STARTB has a lower voltage level than START, STARTB is high enough to bring up N11 to be turned on after power-up sequence. It reduces the burden to deliver the VDDR power rail from a start-up circuit block to the macro block.

Figure 13:
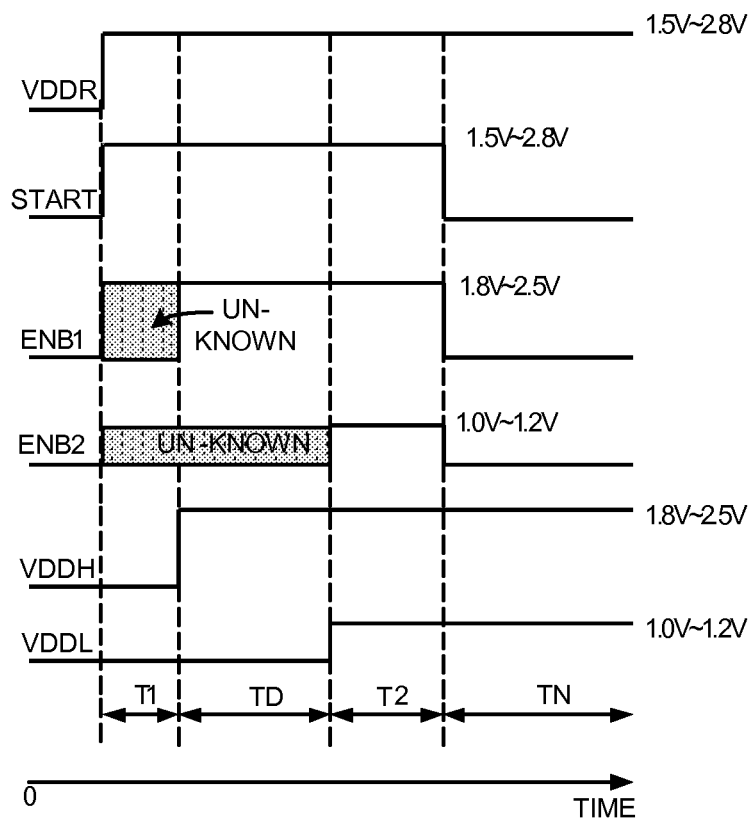
FIG. 13 is a timing diagram for a power up sequence wherein VDDH is turned on earlier than VDDL for the circuit shown in FIGS. 9, 10 and 11.

FIG. 13 is the timing diagram for a power-up sequence when VDDH is turned on earlier than VDDL. It also depicts ENB1 and ENB2 according to START. ENB1 and ENB2 are activated along with VDDH and VDDL, respectively because ENB1 are generated from cross-coupled logic 1120 which uses VDDH in FIG. 11 and ENB2 are generated from INV2 and INV3 which use VDDL in FIG. 11.

During T1, the drain of N10 (1102) in FIG. 11 is discharged to ground because START turns on N10. STARTB is also discharged to ground because the NMOS of INV2 (see FIG. 2) is turned on by START. ENB1 and ENB2 become high impedance because there is no power on VDDH and VDDL. No leakage current is seen at both VDDH and VDDL.

During Td, VDDH and VDDL are turned on and off, respectively. In FIG. 11, ENB1 starts to be charged to VDDH because the drain of N10 was discharged to ground during T1 and makes P11 turned on. Accordingly, ENB1 makes P11 turned off and prevent the leakage current from VDDH. STARTB is still discharged to ground and makes N11 turned off. Thus there is no leakage current during Td in FIG. 11.

In FIG. 10, ENB1 discharges OUTB and Y to ground through N3 and N4, respectively. X becomes high impedance because of lack of VDDL but it does not affect N1 because its drain and source have the same potential to 0V. P2 is turned on and OUT is charged to VDDH because OUTB is discharged to ground through N3. There is no leakage current from VDDH to ground during Td in FIG. 10.

During T2, both VDDH and VDDL are turned on and ENB2 also becomes high in FIG. 11. It charges X to VDDL but does not affect the status of Td because N1 is still turned off.

During Tn, in FIG. 11, START becomes logic low for the normal operation. Accordingly ENB1 and ENB2 are changed to logic low as well. In FIG. 10 N3 and N4 are turned off and the cross coupled logic works like the conventional level shifter in FIG. 1. NOR1 has inverter functions because ENB2 is low and its main functionality will be explained in 3.2.

Figure 14:
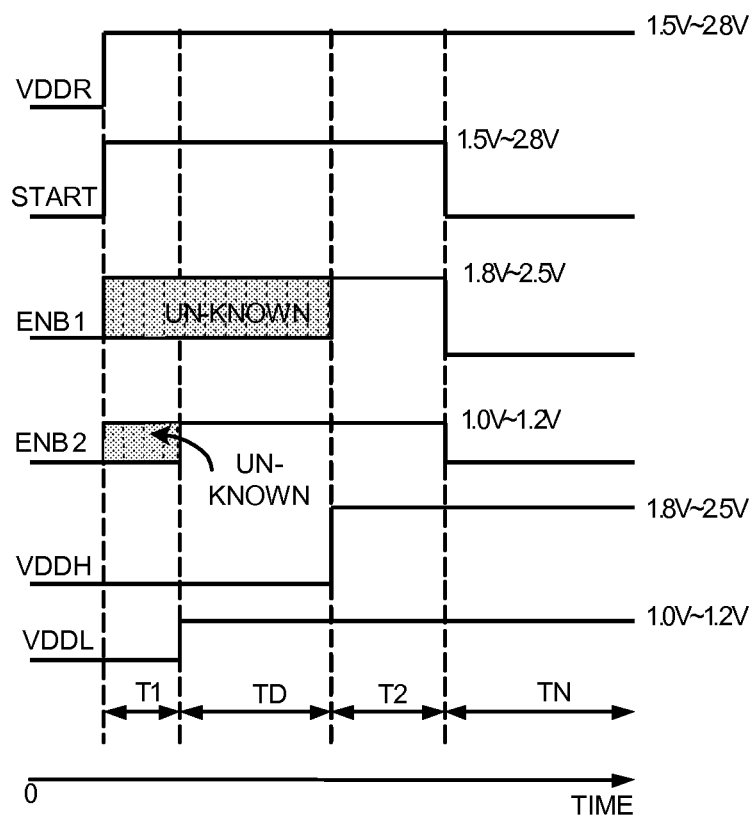
FIG. 14 is a timing diagram for power up sequence when VDDL is turned on earlier than VDDH as provided by the circuitry of FIGS. 9, 10 and 11.

FIG. 14 is the timing diagram for power-up sequence when VDDL is turned on earlier than VDDH. It also depicts ENB1 and ENB2 according to START. ENB1 and ENB2 are activated along with VDDH and VDDL, respectively because ENB1 are generated from cross-coupled logic which uses VDDH in FIG. 10 and ENB2 are generated from INV2 and INV3 which use VDDL in FIG. 11.

During T1, the drain of N10 in FIG. 11 is discharged to ground because START turns on N10. STARTB is also discharged to ground because NMOS of INV2 is turned on by START. ENB1 and ENB2 become high impedance because there is no power on VDDH and VDDL. No leakage current is seen at both VDDH and VDDL.

During Td, in FIG. 11, STARTB is still low and ENB2 is charged to VDDL. But ENB1 is still high impedance because N11 and P11 are turned off and on, respectively. In FIG. 10, X and Y are charged to VDDL and discharged to ground, respectively. OUT keeps a high impedance because of a lack of VDDH.

Figure 4:
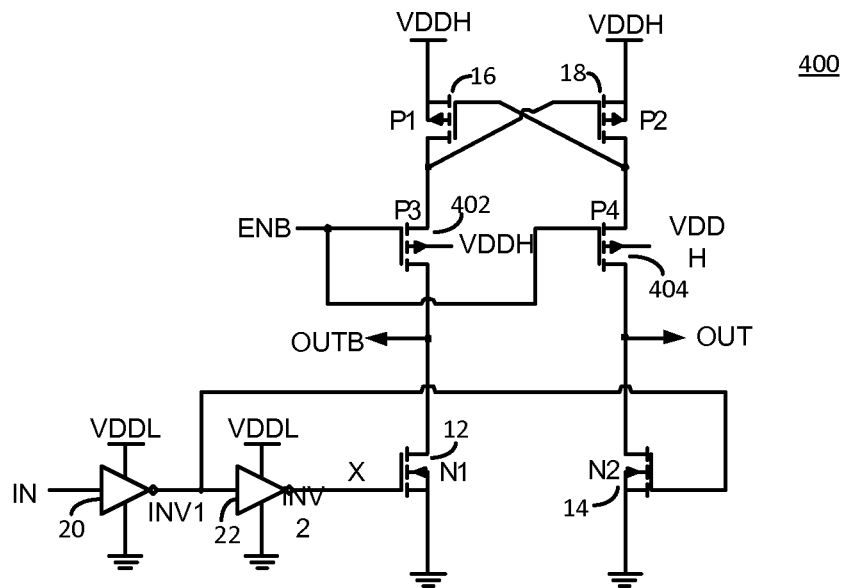
FIG. 4 is a circuit diagram illustrating another example of a prior art level shifter.
Figure 5:
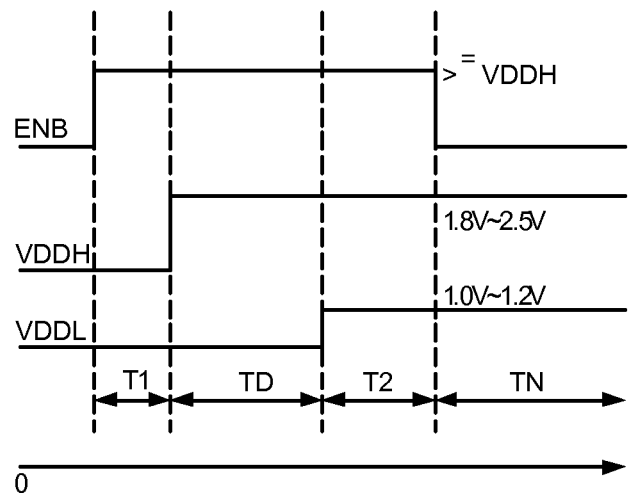
FIG. 5 is a timing diagram illustrating relationships among signals with the circuit shown in FIG. 4.
Figure 6:
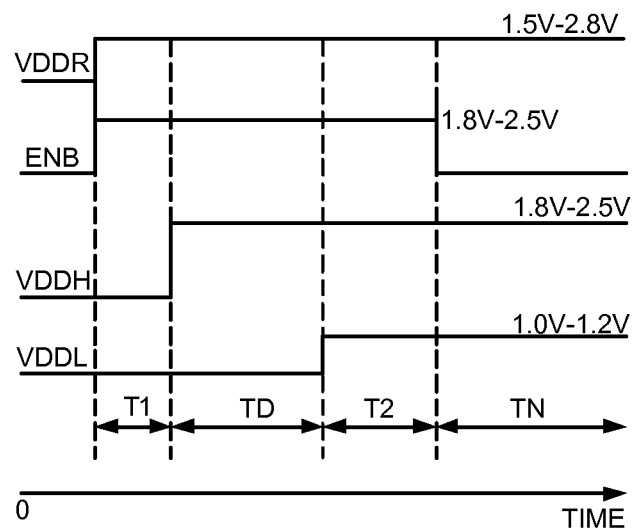
FIG. 6 is a timing diagram illustrating a VDDR signal serving as a first power up supply provided during a startup operation.
Figure 7:
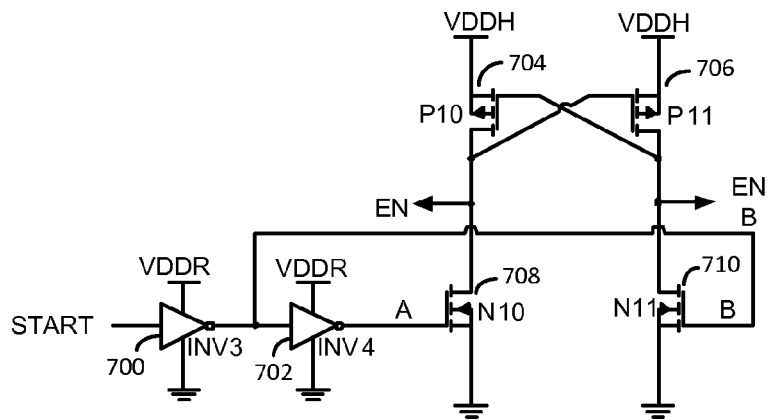
FIG. 7 is a circuit diagram illustrating one example of a prior art enable signal generator.
Figure 8:
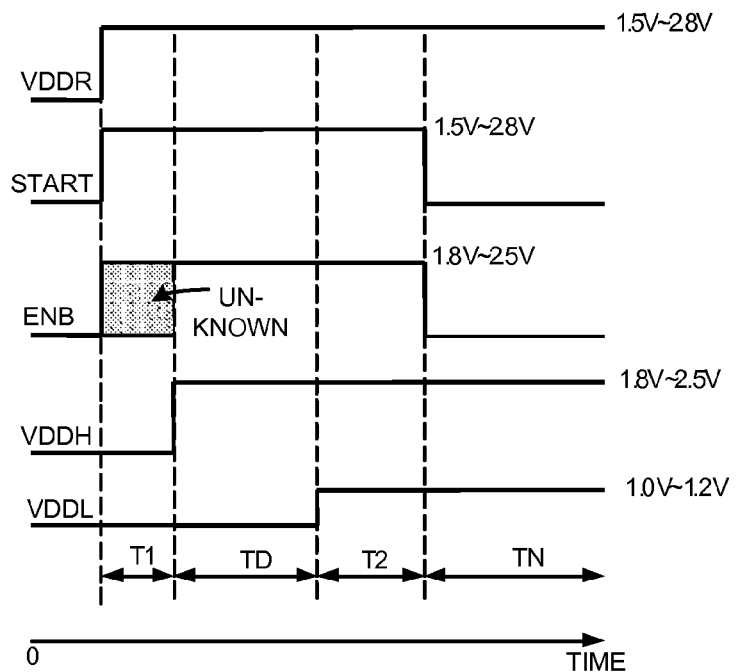
FIG. 8 is a timing diagram illustrating signals associated with FIG. 7 in operation.

A reason that nor gate NOR1 is used with input, IN, in FIG. 10, is that if NOR1 is replaced with an inverter like that of FIG. 4, the voltage of Y depends on IN and there would be leakage current from VDDL to ground through N4 when IN is logic 'low' because of high impedance of ENB1. Actually, IN is from core block and its logic value can have either logic 'high' or 'low'. Thus, it is important that inverter is replaced with nor gate to block the leakage current during Td.

During T2, both VDDH and VDDL are turned on and ENB1 also becomes high in FIG. 11. It discharges Y to ground and OUT is charged to VDDH. There is no leakage current during T2.

During Tn, in FIG. 11, START becomes logic low for the normal operation. Accordingly ENB1 and ENB2 are changed to logic low as well. In FIG. 10 N3 and N4 are turned off and the cross coupled logic works like the conventional level shifter in FIG. 1.

Among other advantages, the lower-to-higher voltage level shifter prevents silicon break down and the leakage current from power domain transition with independency of power-up sequence and can be directly applied to conventional designs with no performance degradation. Moreover, it does not require additional power to bring the start-up signal and simplifies layout and management in SOC designs.

Also, integrated circuit design systems (e.g. work stations with digital processors) are known that create integrated circuits based on executable instructions stored on a computer readable memory such as but not limited to CDROM, RAM, other forms of ROM, hard drives, distributed memory etc. The instructions may be represented by any suitable language such as but not limited to hardware descriptor language or other suitable language. The computer readable medium, such as ROM, RAM or any other suitable computer readable medium contains the executable instructions that when executed by the integrated circuit design system causes the integrated circuit design system to produce an integrated circuit that includes the I/O circuitry, core logic, level shifting circuitry and enable signal generator logic as set forth above. The code is executed by one or more processing devices in a work station or system (not shown). As such, the logic (e.g., circuits) described herein may also be produced as integrated circuits by such integrated circuit systems executing the instructions.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. An integrated circuit comprising:
    input/output (I/O) circuitry;
    core logic operatively coupled to the I/O circuit;
    level shifting circuitry, operatively coupled to the core logic and to provide level shifted data to/from the I/O circuitry comprising at least:
        a plurality of PMOS transistors and first and second NMOS transistors arranged as cross coupled logic;
        a third NMOS transistor operatively coupled in parallel with the first NMOS transistor;
        a fourth NMOS transistor operatively coupled to a gate of the second NMOS transistor, the third and fourth NMOS transistors operative to control leakage current of the cross coupled logic during a startup condition; and
    NOR logic having an output operatively coupled to the fourth NMOS transistor and an input operatively responsive to input data and to one of the pair of enable signals; and the third and fourth NMOS transistors operatively responsive to the other of the pair of enable signals.

2. The integrated circuit of claim 1 wherein the level shifting circuitry is operatively responsive to a pair of enable signals wherein each of the enable signals has a different logical high level.

3. The integrated circuit of claim 1 wherein the cross coupled logic produces complimentary output signals based on the input data and wherein the level shifting circuitry comprises an inverter interposed between the NOR logic and a gate of the first NMOS transistor.

4. An integrated circuit comprising:
    input/output (I/O) circuitry;
    core logic operatively coupled to the I/O circuit;
    level shifting circuitry, operatively coupled to the core logic and to provide level shifted data to/from the I/O circuitry comprising at least:
        a plurality of PMOS transistors and first and second NMOS transistors arranged in a first cross coupled logic;

a third NMOS transistor operatively coupled in parallel with the first NMOS transistor; and a fourth NMOS transistor operatively coupled to a gate of the second NMOS transistor, the third and fourth NMOS transistors operative to control leakage current of the first cross coupled logic during a startup condition;

enable signal generator logic operative to generate a pair of enable signals, for the level shifting circuitry during the startup condition, whose logic high levels correspond to each of a plurality of different voltage level supply voltages of the level shifting circuit; and NOR logic having an output operatively coupled to the fourth NMOS transistor and an input operatively responsive to input data and to one of the pair of enable signals; and the third and fourth NMOS transistors operatively responsive to the other of the pair of enable signals.

5. The integrated circuit of claim 4 wherein the first cross coupled logic produces complimentary output signals based on the input data and wherein the level shifting circuitry comprises an inverter interposed between the NOR logic and a gate of the first NMOS transistor.

6. A display device comprising:
a display;
an integrated circuit, operative to provide data for the display, comprising:
input/output (I/O) circuitry operatively coupled to the display;
core logic operatively coupled to the I/O circuit;
level shifting circuitry, operatively coupled to the core logic and to provide level shifted data to/from the I/O circuitry comprising at least:
a plurality of PMOS transistors and first and second NMOS transistors arranged in a first cross coupled logic;
a third NMOS transistor operatively coupled in parallel with the first NMOS transistor; and
a fourth NMOS transistor operatively coupled to a gate of the second NMOS transistor, the third and fourth NMOS transistors operative to control leakage current of the first cross coupled logic during a startup condition;
enable signal generator logic operative to generate a pair of enable signals, for the level shifting circuitry during the startup condition, whose logic high levels correspond to each of a plurality of different voltage level supply voltages of the level shifting circuit; and
wherein the integrated circuit comprises NOR logic having an output operatively coupled to the fourth NMOS transistor and an input operatively responsive to input data and to one of the pair of enable signals; and the third and fourth NMOS transistors operatively responsive to the other of the pair of enable signals.

7. The device of claim 6 wherein the cross coupled logic produces complimentary output signals based on the input data and wherein the level shifting circuitry comprises an inverter interposed between the NOR logic and a gate of the first NMOS transistor.

8. A non-transitory computer readable medium comprising executable instructions that when executed by an integrated circuit design system, causes the integrated circuit design system to produce:
an integrated circuit comprising:
input/output (I/O) circuitry;
core logic operatively coupled to the I/O circuit;
level shifting circuitry, operatively coupled to the core logic and to provide level shifted data to/from the I/O circuitry comprising at least:
a plurality of PMOS transistors and first and second NMOS transistors arranged in a first cross coupled logic;
a third NMOS transistor operatively coupled in parallel with the first NMOS transistor; and
a fourth NMOS transistor operatively coupled to a gate of the second NMOS transistor, the third and fourth NMOS transistors operative to control leakage current of the first cross coupled logic during a startup condition;
enable signal generator logic operative to generate a pair of enable signals, for the level shifting circuitry during the startup condition, whose logic high levels correspond to each of a plurality of different voltage level supply voltages of the level shifting circuit; and
wherein the executable instructions that when executed by the integrated circuit design system, causes the integrated circuit design system to produce NOR logic having an output operatively coupled to the fourth NMOS transistor and an input operatively responsive to input data and to one of the pair of enable signals; and the third and fourth NMOS transistors that are operatively responsive to the other of the pair of enable signals.

9. The non-transitory computer readable medium of claim 8 wherein the executable instructions that when executed by the integrated circuit design system, causes the integrated circuit design system to produce the cross coupled logic that produces complimentary output signals based on the input data and the level shifting circuitry that comprises an inverter interposed between the NOR logic and a gate of the first NMOS transistor.

10. The non-transitory computer readable medium of claim 9 wherein the executable instructions that when executed by the integrated circuit design system, causes the integrated circuit design system to produce the enable signal generating logic that comprises:
a plurality of PMOS transistors and first and second NMOS transistors arranged in a second cross coupled logic that is responsive to a start power up signal and that produces a first or the pair of enable signals; and
a plurality of serially connected inverter circuits, operatively coupled to the second cross coupled logic and responsive to the start power up signal, the plurality of serially connected inverter circuits operative to produce a second of the pair of enable signals.

11. An integrated circuit comprising:
input/output (I/O) circuitry;
core logic operatively coupled to the I/O circuit;
level shifting circuitry, operatively coupled to the core logic and to provide level shifted data to/from the I/O circuitry comprising at least:
a plurality of PMOS transistors and first and second NMOS transistors arranged in a first cross coupled logic;
a third NMOS transistor operatively coupled in parallel with the first NMOS transistor; and
a fourth NMOS transistor operatively coupled to a gate of the second NMOS transistor, the third and fourth NMOS transistors operative to control leakage current of the cross coupled logic during a startup condition;
enable signal generator logic operative to generate a pair of enable signals, for the level shifting circuitry during the startup condition, whose logic high levels correspond to each of a plurality of different voltage level supply voltages of the level shifting circuit;

wherein the enable signal generating logic comprises:

a plurality of PMOS transistors and first and second NMOS transistors arranged as second cross coupled logic that is responsive to a start power up signal and that produces a first of the pair of enable signals; and a plurality of serially connected inverter circuits, operatively coupled to the second cross coupled logic and responsive to the start power up signal, the plurality of serially connected inverter circuits operative to produce a second of the pair of enable signals.

12. A display device comprising:

a display;

an integrated circuit, operative to provide data for the display, comprising:

input/output (I/O) circuitry operatively coupled to the display;

core logic operatively coupled to the I/O circuit;

level shifting circuitry, operatively coupled to the core logic and to provide level shifted data to/from the I/O circuitry comprising at least:

a plurality of PMOS transistors and first and second NMOS transistors arranged in a first cross coupled logic;

a third NMOS transistor operatively coupled in parallel with the first NMOS transistor; and a fourth NMOS transistor operatively coupled to a gate of the second NMOS transistor, the third and fourth NMOS transistors operative to control leakage current of the cross coupled logic during a startup condition;

enable signal generator logic operative to generate a pair of enable signals, for the level shifting circuitry during the startup condition, whose logic high levels correspond to each of a plurality of different voltage level supply voltages of the level shifting circuit;

wherein the enable signal generating logic comprises:

a plurality of PMOS transistors and first and second NMOS transistors arranged in a second cross coupled logic that is responsive to a start power up signal and that produces a first or the pair of enable signals; and a plurality of serially connected inverter circuits, operatively coupled to the second cross coupled logic and responsive to the start power up signal, the plurality of serially connected inverter circuits operative to produce a second of the pair of enable signals.

\* \* \* \* \*